United States Patent
Huhse et al.

(10) Patent No.: US 7,522,285 B2
(45) Date of Patent: Apr. 21, 2009

(54) METHOD FOR DETERMINING THE FREQUENCY RESPONSE OF AN ELECTROOPTICAL COMPONENT

(75) Inventors: Dieter Huhse, Berlin (DE); Olaf Reimann, Berlin (DE)

(73) Assignee: Technische Universitaet Berlin, Berlin (DE)

( * ) Notice: Subject to any disclaimer, the term of this patent is extended or adjusted under 35 U.S.C. 154(b) by 68 days.

(21) Appl. No.: 10/573,116

(22) PCT Filed: Sep. 23, 2004

(86) PCT No.: PCT/DE2004/002160

§ 371 (c)(1),
(2), (4) Date: Mar. 23, 2006

(87) PCT Pub. No.: WO2005/031377

PCT Pub. Date: Apr. 7, 2005

(65) Prior Publication Data

US 2006/0279272 A1  Dec. 14, 2006

(30) Foreign Application Priority Data

Sep. 26, 2003  (DE) ............................... 103 46 379

(51) Int. Cl.
*G01B 9/02* (2006.01)
(52) U.S. Cl. .................. 356/484; 356/73.1; 356/477
(58) Field of Classification Search ............ 356/73.1, 356/477, 484
See application file for complete search history.

(56) References Cited

U.S. PATENT DOCUMENTS 3,445,167 A  5/1969  Armstrong et al.

(Continued)

FOREIGN PATENT DOCUMENTS

DE  100 47 170 A1  4/2002

(Continued)

OTHER PUBLICATIONS

Kawanishi et al, A Very Wide-Band Frequency Response Measurement System Using Optical Heterodyne Detection, IEEE Transactions on Instrumentation and Measurement, vol. 38, No. 2, Apr. 1989, pp. 569-573.*

(Continued)

*Primary Examiner*—Samuel A Turner
(74) *Attorney, Agent, or Firm*—Rothwell, Figg, Ernst & Manbeck, P.C.

(57) ABSTRACT

The aim of the invention is to provide a method for determining the frequency response of an electrooptical component, particularly, for example, of a light-generating or light-modulating component, which is easy to carry out. To this end, the invention provides a method during which optical pulses with a pulse frequency (fp) are generated. The electrooptical component (60) is controlled by an electrical measuring signal (Smess) with a measuring frequency (fmess) in such a manner that an optical output signal (Saus) is formed that is modulated with the measuring frequency (fmess). The measuring frequency (fmess) is equal to an integral multiple of the pulse frequency (fp) plus a predetermined frequency offset ($g(D)$ f). The pulses and the output signal (Saus) are mixed, and a mixed product (M) is detected whose modulation frequency corresponds to the predetermined frequency offset ($g(D)f$). The mixed product indicates the frequency response of the electrooptical component (60) at the measuring frequency (fmess).

25 Claims, 3 Drawing Sheets

U.S. PATENT DOCUMENTS

Figure 1:
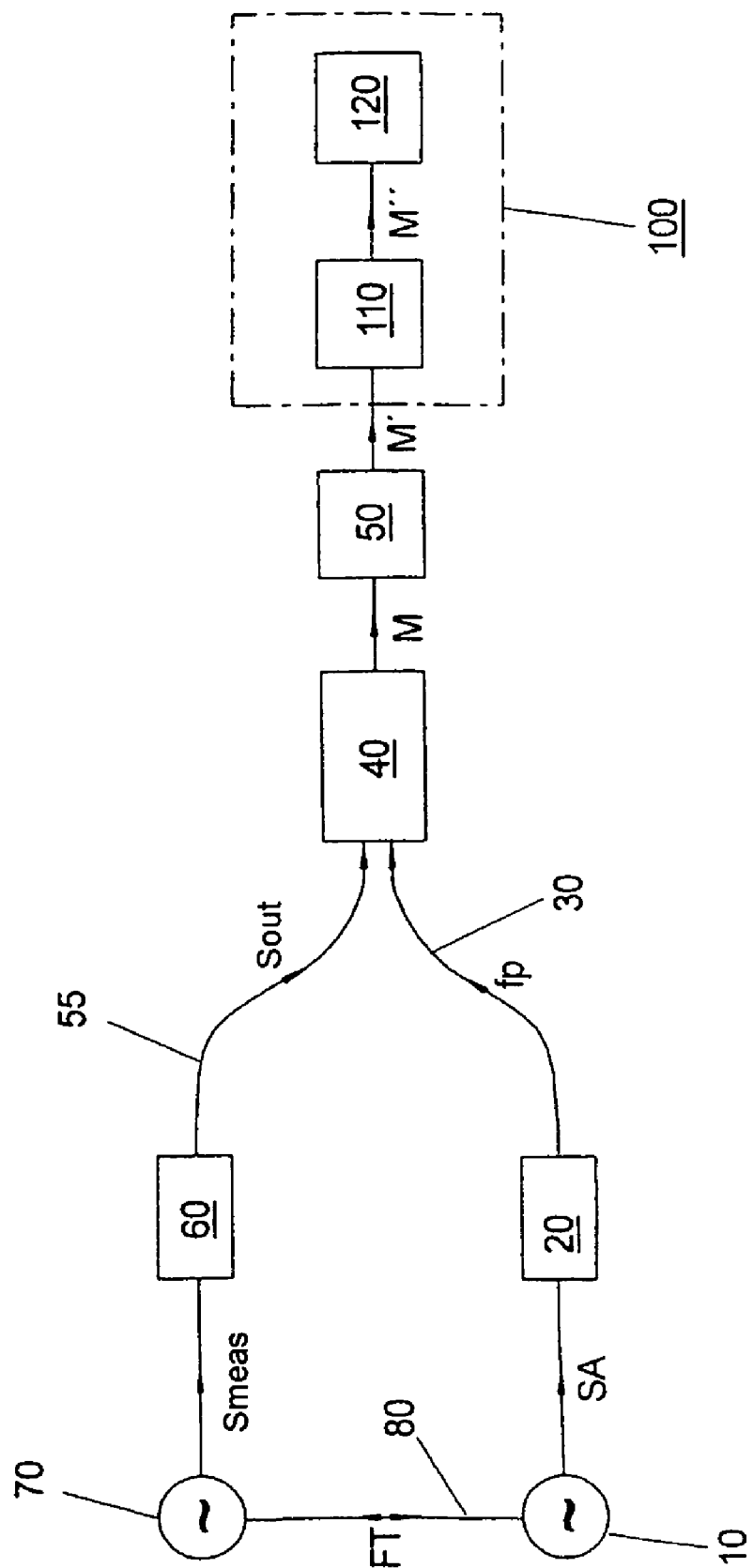

| | | | |
|---|---|---|---|
| 4,940,331 A * | 7/1990 | Wyeth et al. | 356/477 |
| 5,293,213 A * | 3/1994 | Klein et al. | 356/484 |
| 5,499,190 A | 3/1996 | Takahashi et al. | |
| 5,614,834 A | 3/1997 | Black et al. | |
| 5,748,309 A * | 5/1998 | van der Weide et al. | 356/326 |
| 5,955,875 A | 9/1999 | Twichell et al. | |
| 6,028,424 A | 2/2000 | Twichell et al. | |
| 6,160,626 A * | 12/2000 | Debeau et al. | 356/451 |
| 6,388,753 B1 | 5/2002 | Hall et al. | |
| 7,239,396 B2 * | 7/2007 | Krause et al. | 356/477 |
| 2002/0097761 A1 | 7/2002 | Sucha et al. | |
| 2004/0051926 A1 | 3/2004 | Gulden et al. | |

FOREIGN PATENT DOCUMENTS

| | | |
|---|---|---|
| JP | 02064433 | 3/1990 |
| JP | 05347346 | 12/1993 |

OTHER PUBLICATIONS

Kawanishi et al, Wide-Band Frequency-Response Measurement of Optical Receivers Using Optical Heterodyne Detection, Journal of Lightwave Technology, vol. 7, No. 1, Jan. 1989, pp. 92-98.*

Schimpe et al., "Characterisation of Frequency Response of 1.5 MUM INGAASP DFB Laser Diode and INGAAS . . . ", Electronics Letters, vol. 22, No. 9, Apr. 24, 1986, pp. 453-454.

Reimann et al., "Advanced semiconductor laser based electro-optical sampling system using soliton pulse compression for direct probing at 1.55-/spl mu/m wavelength", Lasers and Electro-Optics Society Annual Meeting, 1988, vol. 1, Dec. 1, 1998, pp. 215-216.

Reimann et al., "Low jitter dual semiconductor laser system using electrical phase shift for fast temporal scanning in time-resolved pump and probe experiments", Lasers and Electro-Optics, 1999, vol. 2, Aug. 30, 1999, pp. 203-204.

* cited by examiner

METHOD FOR DETERMINING THE FREQUENCY RESPONSE OF AN ELECTROOPTICAL COMPONENT

CROSS REFERENCE TO RELATED APPLICATION

This application is a 35 USC § 371 National Phase Entry Application from PCT/DE2004/002160, filed Sep. 23, 2004, and designating the United States.

The invention is based on the object of specifying a method for determining the frequency response of an electrooptical component, in particular for example of a light-generating or light-modulating component, which can be carried out in a very simple manner.

BRIEF SUMMARY OF THE INVENTION

This object is achieved according to the invention by means of a method having the features in accordance with a method for determining the frequency response of an electrooptical component (60) within a predefined frequency band, in which optical pulses having a first optical carrier frequency and having a predefined pulse frequency (fp) are generated. the electrooptical component (60) is driven with an electrical measurement signal (Smeas) having a predefined measurement frequency (fmeas) in such a way that an optical output signal (Sout)—modulated with the measurement frequency (fmeas)—having a predefined second optical carrier frequency is formed, the measurement frequency (fmeas) being an integral multiple of the pulse frequency (fp) plus a predefined frequency offset (Δf), the pulses and the output signal (Sout) are subjected to a joint frequency mixing and, from the mixed products formed during the frequency mixing, at least one mixed product (M") is detected whose modulation frequency corresponds to the predefined frequency offset (Δf). the frequency behavior of the electrooptical component (60) at the measurement frequency (fmeas) is determined on the basis of the intensity, in particular the power. the amplitude or the root-mean-square value, of the detected mixed product (M"), and the frequency behavior of the electrooptical component (60) is determined in the manner described for all measurement frequencies (fmeas) which correspond to an integral multiple of the pulse frequency (fp) plus the predefined frequency offset (Δf) and which lie within the predefined frequency band. Advantageous refinements of the method according to the invention are specified in subclaims.

Accordingly, the invention provides a method in which optical pulses having a first optical carrier frequency and having a predefined pulse frequency are generated. The electrooptical component whose frequency response is to be determined is driven with an electrical measurement signal having a predefined measurement frequency in such a way that it forms an optical output signal—modulated with the measurement frequency—having a predefined second optical carrier frequency. In this case, the measurement frequency is chosen in such a way that it amounts to an integral multiple of the pulse frequency of the optical pulses plus a predefined frequency offset. The optical pulses and the optical output signal are jointly subjected to a frequency mixing, in which case, from the optical mixed products formed during the frequency mixing, at least one mixed product is detected whose modulation frequency corresponds to the predefined frequency offset. The frequency behavior of the electrooptical component is subsequently determined on the basis of the quantity, in particular the power, the amplitude or the root-mean-square value, of the selected mixed product. The detection of the mixed product and the determination of the frequency behavior of the electrooptical component are carried out successively for all measurement frequencies which correspond to an integral multiple of the pulse frequency of the optical pulses plus the predefined frequency offset and which lie within a predefined frequency band within which the frequency behavior of the electrooptical component is intended to be determined.

One essential advantage of the method according to the invention is that it can be carried out in a very simple manner since, by way of example, a pulsed laser used for generating the optical pulses only ever has to be driven with one and the same pulse frequency. Since pulses are generated by the pulsed laser, the frequency is spectrum of the optical output signal generated by the pulsed laser has a very wide frequency spectrum extending into the range of up to hundreds of GHz. In this case, the frequency spectrum of the pulsed laser comprises a frequency comb with a line spacing that corresponds to the pulse frequency. In other words, the power spectrum of the laser pulses comprises lines having frequencies n*fp (fp: pulse frequency), where n denotes an integer. In this case, each of the spectral lines of the frequency comb has an intensity Rn. The frequency spectrum of the electrooptical component can then be determined for all measurement frequencies which correspond to an integral multiple of the pulse frequency plus a predefined frequency offset (e.g. 1 kHz). When the optical signals generated by the pulsed laser and the electrooptical component are mixed, a signal having a modulation frequency which corresponds to the predefined frequency offset occurs, inter alia. By measuring at least one mixed product whose modulation frequency corresponds to the frequency offset, the frequency behavior of the electrooptical component can thus be ascertained for each measurement frequency.

To summarize, the method according to the invention thus has the advantage that the frequency response of the electrooptical component can be determined for different measurement frequencies even though it is only ever necessary to evaluate one measurement quantity having one and the same modulation frequency, namely having the predefined frequency offset.

The predefined frequency offset which defines the mixed products to be detected may have a positive or negative magnitude. This means that a frequency which may amount to an integral multiple of the pulse frequency of the optical pulses plus or minus a predefined (positive) frequency offset may be chosen as the measurement frequency.

Preferably from the mixed products, exclusively those mixed products are detected which have the summation frequency formed from the first and second optical carrier frequencies as optical carrier frequency.

As an alternative, but likewise preferably, from the mixed products, exclusively those mixed products are detected which have the difference frequency formed from the first and second optical carrier frequencies as optical carrier frequency.

In order to achieve a particularly high measurement accuracy, it is regarded as advantageous if the spectral line strengths of the optical pulses are determined beforehand and if they are taken into account when determining the frequency behavior of the electrooptical component. The "spectral line strengths" may be determined e.g. by Fourier transformation of the autocorrelation of the optical pulses.

When determining the frequency behavior of the electrooptical component, from the spectral line strengths of the optical pulses that have been determined beforehand, the spectral line strength of in each case that spectral line whose spectral line frequency corresponds to the difference frequency between the respective measurement frequency and the predefined frequency offset is taken into account.

The spectral line strengths of the optical pulses can be taken into account in a particularly simple manner and hence advantageously by means of a mixed product intensity value that specifies the intensity of the selected mixed product being divided by a spectral line value specifying the spectral line strength of the spectral line of the optical pulses which is associated with the selected mixed product. A frequency response value of the electrooptical component is in each case formed by this division.

A nonlinear element through which the optical pulses and the optical output signal are radiated is used for the purpose of forming the optical mixed products.

As an alternative, by way of example, a 2-photon detector may also be used for the purpose of forming and/or detecting the optical mixed products.

Moreover, an optical rectifier, in particular for example a nonlinear crystal, may also be used for the purpose of forming and/or detecting the optical mixed products.

The measurement frequency may preferably be calculated in accordance with the following determination equation:

$$fmeas = m*fp + \Delta f$$

where fmeas denotes the measurement frequency, $\Delta f$ denotes the frequency offset and fp denotes the pulse frequency.

The method according to the invention can be used for example to determine the frequency response of an electrooptical component formed from a light source, in particular a laser (e.g. an unpulsed CW laser) or a light-emitting diode, and a modulator. The modulator may be for example a drivable modulator, that is to say for example an electrooptical, electroacoustic or similar modulator. If an unpulsed laser is used as the light source, then primarily the frequency response of the modulator is measured when carrying out the method according to the invention.

Moreover, in an advantageous manner, the frequency response of an optoelectrical transducer is simultaneously determined by radiating the optical output signal generated by the electrooptical component into the optoelectrical transducer, measuring an electrical transducer signal generated by the optoelectrical transducer with formation of a transducer measured value, and using the transducer measured value and the measured frequency response of the electrooptical component to determine the frequency response of the optoelectrical transducer.

In this case, the frequency response of the optoelectrical transducer may be derived in a particularly simple manner and hence advantageously by means of the transducer measured value being divided by a frequency response value of the electrooptical component.

Preferably, the pulse frequency of the optical pulses is generated by means of a pulse generator and the measurement frequency of the measurement signal is generated by means of a sine-wave generator, the two generators being synchronized, for example being coupled in phase-locked fashion.

Moreover, in accordance with one advantageous development of the method, the phase response of the electrooptical component may additionally be measured.

For this purpose, preferably, a phase signal is generated which specifies the phase difference between the drive signal of the pulsed laser and the electrical measurement signal. The phase angle between the generated phase signal and the detected mixed product is subsequently measured for each of the measurement frequencies in each case with formation of a phase measured value.

The phase response of the optoelectrical transducer may also be measured in a corresponding manner.

The invention is furthermore based on the object of specifying an arrangement that can be used to determine the frequency response of an, in particular, light-generating or light-modulating electrooptical component in a very simple manner.

This object is achieved according to the invention by means of an arrangement having the features in accordance with a method for determining the frequency response of an electrooptical component (60) within a predefined frequency band, in which optical pulses having a first optical carrier frequency and having a predefined pulse frequency (fp) are generated, the electrooptical component (60) is driven with an electrical measurement signal (Smeas) having a predefined measurement frequency (fmeas) in such a way that an optical output signal (Sout)—modulated with the measurement frequency (fmeas)—having a predefined second optical carrier frequency is formed, the measurement frequency (fmeas) being an integral multiple of the pulse frequency (fp) plus a predefined frequency offset ($\Delta f$). the pulses and the output signal (Sout) are subjected to a joint frequency mixing and, from the mixed products formed during the frequency mixing, at least one mixed product (M") is detected whose modulation frequency corresponds to the predefined frequency offset (fp). the frequency behavior of the electrooptical component (60) at the measurement frequency (fmeas) is determined on the basis of the intensity, in particular the power, the amplitude or the root-mean-square value, of the detected mixed product (M"), and the frequency behavior of the electrooptical component (60) is determined in the manner described for all measurement frequencies (fmeas) which correspond to an integral multiple of the pulse frequency (fp) plus the predefined frequency offset ($\Delta f$) and which lie within the predefined frequency band. The method is characterized in that the phase response of the electrooptical component (60) is additionally measured and in that the phase response of the optoelectrical transducer (400) is additionally measured.

With regard to the advantages of the arrangement according to the invention, reference is made to the above explanations in connection with the method according to the invention.

BREIF DESCRIPTION OF THE DRAWINGS

Figure 2:
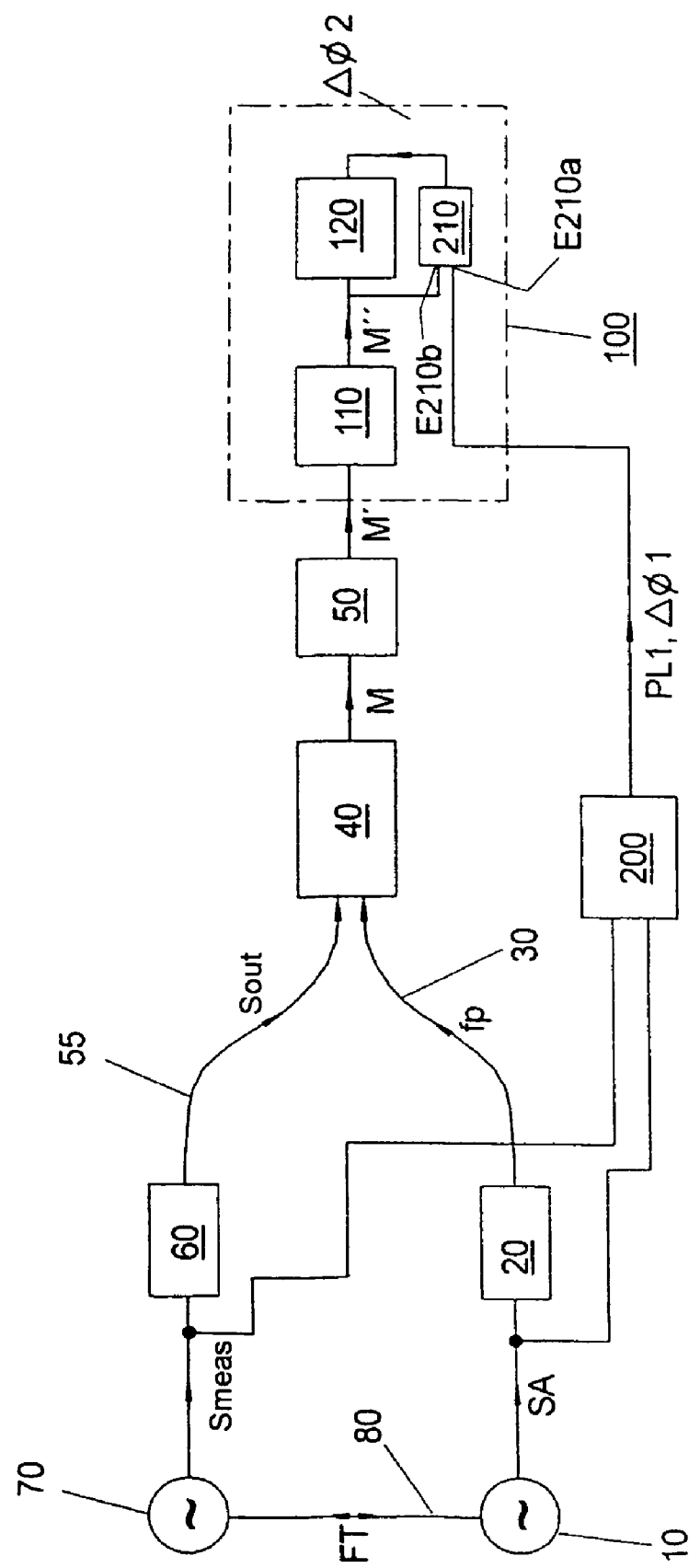
Figure 3:
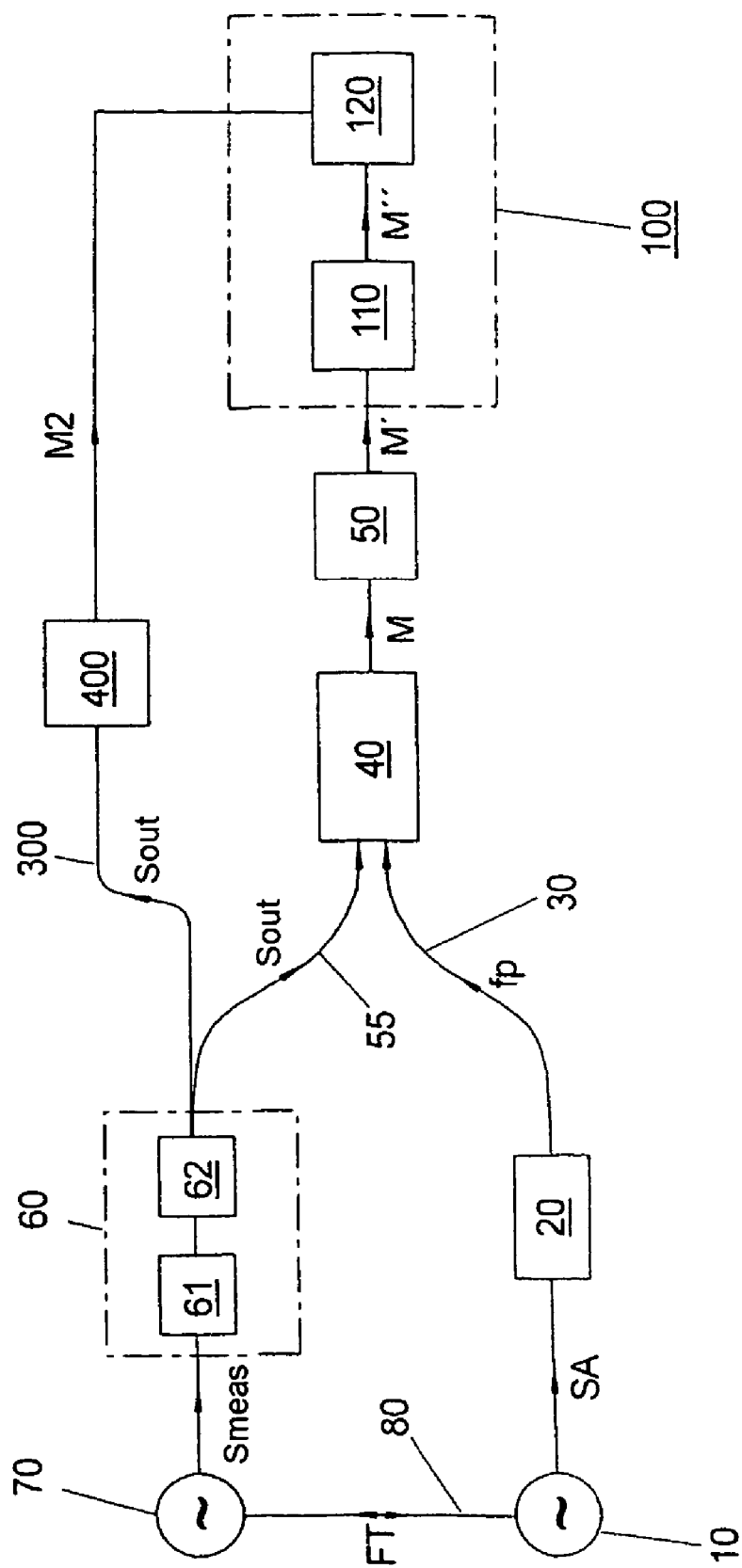

For elucidating the invention:

FIG. 1 shows a first exemplary embodiment of an arrangement according to the invention that can be used to carry out the method according to the invention, FIG. 2 shows a second exemplary embodiment of an arrangement according to the invention, in which the phase response of an electrooptical component can additionally be determined, and FIG. 3 shows a third exemplary embodiment of an arrangement according to the invention.

DETAILED DESCRIPTION OF THE INVENTION

FIG. 1 reveals an electrical high-frequency source 10 (e.g. pulse generator), which drives a pulsed laser 20.

The pulsed laser 20 is connected by an optical waveguide 30 to a nonlinear crystal 40 to which a photodetector 50 is coupled on the output side. The nonlinear crystal 40 is connected by means of a further optical waveguide 55 to an electrooptical component 60, which may be for example a light-emitting diode or a laser.

The electrical driving of the electrooptical component 60 is effected by a second electrical high-frequency source 70 (e.g. sine-wave generator), which is connected to the first electrical high-frequency source 10 by means of a synchronization line 80. A synchronization signal FT is transmitted via the synchronization line 80. The synchronization signal FT may have a frequency of 10 MHz, by way of example.

The arrangement in accordance with FIG. 1 is operated as follows:

The laser 20, which may be for example a short-pulse laser with low phase noise, is driven by the first electrical high-frequency source 10 with a drive signal SA in such a way that the laser 20 generates short laser pulses with a repetition rate fp. The power spectrum of these optical laser pulses thus comprises a frequency comb with a line spacing fa where fa=fp, that is to say thus comprises spectral lines having frequencies n*fp, where n denotes an integer. The spectral lines having the frequencies n*fp in each case have the intensity In.

In this case, the full width at half maximum of the laser pulses is chosen such that a sufficiently strong spectral line still remains or exists at the maximum required measurement frequency for the characterization of the electrooptical component 60 within a predefined frequency band. This is possible without any problems, however, up to frequencies of hundreds of GHz, since correspondingly short pulses can readily be generated by commercially available pulsed lasers.

The exact strength or intensity of the individual spectral lines of the line spectrum of the pulsed laser 20 can be measured without any problems and with high accuracy up to frequencies in the terahertz range with the aid of a so-called autocorrelator, which is likewise commercially available. In this case, the spectral line strengths are formed by the Fourier transform of the autocorrelation of the optical pulses.

The frequency response of the electrooptical component 60 is then determined as follows: the electrooptical component 60 is successively driven in each case with a measurement signal Smeas having the frequency fmeas $$f\text{meas}=m*fp+\Delta f(m=1, 2, \ldots ; \Delta f=\text{const.})$$

where $\Delta f$ denotes a predefined, constant frequency offset.

The electrooptical component 60 then generates, at the respective frequency fmeas, an optical output signal Sout having the intensity Dm, where the quantity Dm describes the frequency behavior to be determined of the electrooptical component 60 at the measurement frequency fmeas.

The optical pulses of the pulsed laser 20 and also the optical output signal Sout of the electrooptical component 60 are then radiated into the nonlinear crystal 40 via the optical waveguides 30 and 55, with the result that a mixing or frequency mixing of the signals occurs. A mixed signal M is then formed which has the following modulation Mod:

$$\text{Mod} = \sum_n I_n D_m ([n-m]f_p + \Delta f)$$

The generated mixed signal M is measured by means of the photodetector 50 with formation of a photodetector signal M'. An HF measuring device 100 having a filter 110 and an evaluation device 120 is connected to the photodetector 50 on the output side. The filter 110 only transmits the frequency $\Delta f$, that is to say the frequency corresponding to the frequency offset. The remaining frequencies, for example the frequency fp or multiples of this frequency, are not transmitted. Thus, all that remains from the modulation "Mod" is the portion for n=m, so that the evaluation device 120 of the HF measuring device 100 detects or utilizes only the mixed product M" having the predefined frequency offset $\Delta f$ as modulation frequency.

The mixed product M", which has the predefined frequency offset $\Delta f$ as frequency and whose magnitude is proportional to the intensity Im*Dm, is thus obtained at the output of the filter 110 of the HF measuring device 100. Since—as explained above, the spectral line strengths of the pulsed laser 20 and thus the factor Im have already been determined by means of the autocorrelation measurement, the quantity Dm apart from the proportionality factor A can be determined directly from the filtered mixed product M" in accordance with $$Dm*A=(A*Im*Dm)/Im$$

If this measurement is then carried out for all values of m for which the measurement frequency fmeas lies within a predefined frequency band, then the complete frequency response of the electrooptical component 60 is obtained for this predefined frequency band.

A wide variety of components such as, for example, laser diodes, light-emitting diodes and laser-modulator units may be characterized as electrooptical components 60.

FIG. 2 shows a modification of the arrangement in accordance with FIG. 1. In addition to the components already explained in connection with FIG. 1, the illustration reveals a first phase angle measuring device 200, which, on the input side, is connected to the output of the high-frequency source 10 and to the output of the second high-frequency source 70. On the output side, the first phase angle measuring device 200 is connected to an input E210$a$ of a second phase angle measuring device 210, the other input E210$b$ of which is connected to the output of the filter 110.

The phase response of the electrooptical component 60 is additionally measured by means of the second phase angle measuring device 210. For this purpose, the first phase angle measuring device 200 generates a phase signal PL1 specifying the phase angle $\Delta\Phi 1$ between the drive signal SA of the pulsed laser 20 and the electrical measurement signal Smeas.

The second phase angle measuring device 210 measures the phase angle $\Delta\Phi 2$ between the generated phase signal PL1 and the phase angle $\Delta\Phi m$ of the filtered-out mixed product m" for each of the measurement frequencies fmeas in each case with formation of a phase measured value $\Delta\Phi \text{tot}(f\text{meas})$. The phase measured values $\Delta\Phi \text{tot}(f\text{meas})$ specify the phase response of the electrooptical component 60.

The phase measured values $\Delta\Phi \text{tot}$ are transmitted from the second phase angle measuring device 210 to the evaluation device 120, where they are evaluated and processed further.

The arrangements in accordance with FIGS. 1 and 2 may for example also be used to characterize an electrooptical component 60 formed by a light source, e.g. a CW laser, and a modulator. Since the CW laser will generally be less frequency-dependent than the modulator, the mixed product M" at the output of the filter 110 will essentially describe only the frequency response of the modulator.

FIG. 3 reveals a further modification of the arrangement in accordance with FIG. 1 as a third exemplary embodiment. It can be discerned in FIG. 3 that the electrooptical component 60 to be characterized is formed by a light source 61, e.g. a CW laser, and a modulator 62.

The modulator 62 of the electrooptical component 60 is connected via a third optical waveguide 300 to an optoelectrical transducer 400, which may be a photodetector, by way of example. The optical output signal Sout generated by the electrooptical component 60 thus passes via the third optical waveguide 300 additionally to the optoelectrical transducer 400, which measures the output signal Sout with formation of a measurement signal or transducer signal M2 and transmits the measurement signal M2 to the HF measuring system 120.

The HF measuring system 120 then measures, by means of the photodetector 50, firstly the frequency behavior of the electrooptical component 60. Afterward, the electrical measurement signal M2 of the optoelectrical transducer 400 is then evaluated in the HF measuring system 120, so that the frequency response of the optoelectrical transducer 400 is also detected metrologically. In this case, the frequency behavior or the frequency response of the electrooptical component 60 is taken into account since the measurement signal M2 represents a type of "superposition" of the frequency response of the electrooptical component 60 and the frequency response of the optoelectrical transducer 400. By virtue of the fact that firstly the frequency behavior of the electrooptical component 60 is determined, this can be "calculated out" from the measurement signal M2 by the HF measuring system 120, so that solely the frequency response of the optoelectrical transducer 400 can be determined despite the "superposition".

The frequency response of the electrooptical component 60 is determined—as explained above—by means of the photodetector 50 and the filter 110. Since the CW laser 61 will generally be less frequency-dependent than the modulator 62, the mixed product M" at the output of the filter 110 will essentially describe the frequency response of the modulator 62.

Moreover, the phase response of the optoelectrical transducer 400 can also be measured by using at least one additional phase angle measuring device which measures the phase angle between the mixed product M" and the electrical measurement signal M2 of the optoelectrical transducer 400 or else between the phase angle PL1—as explained in connection with FIG. 2—and the electrical measurement signal M2 of the optoelectrical transducer 400 and transmits the respective measurement signal to the evaluation device 120. The "additional" phase angle measuring device is not illustrated in FIG. 3 for the sake of clarity.

LIST OF REFERENCE SYMBOLS

10 First high-frequency source
20 Pulsed laser
30 First optical waveguide
40 Nonlinear crystal
50 Photodetector
55 Second optical waveguide
60 Electrooptical component
61 CW laser
62 Modulator
70 High-frequency source
80 Synchronization line
100 HF measuring system
110 Filter
120 Evaluation device
300 Third optical waveguide
400 Optoelectrical transducer.

The invention claimed is:

1. A method for determining the frequency response of an electrooptical component within a predefined frequency band comprising the steps of:

generating optical pulses at a first carrier frequency and a predefined pulse frequency;

driving an electrooptical component with a predefined electrical measurement signal, said predefined electrical measurement signal having a measurement frequency at an integral multiple of said predefined pulse frequency and including an additional predefined frequency offset;

generating an electrooptical component output signal modulated at said measurement frequency, having a predefined second optical carrier frequency;

frequency mixing said optical pulses and said electrooptical component output signal to form a plurality of mixed products detecting at least one mixed product having a modulation frequency which corresponds to said predefined frequency offset;

determining the frequency behavior of said electrooptical component at said measurement frequency based on the intensity of the detected mixed product; and repeating the step of determining the frequency behavior of said electrooptical component at all measurement frequencies corresponding to $n(f_p)+\Delta f$ which lie within said predefined frequency band, where $n(f_p)$ is an integral multiple of said pulse frequency and $\Delta f$ is said predefined frequency offset.

2. The method as claimed in claim 1, wherein the detecting step comprises detecting exclusively those mixed products (M") whose optical carrier frequency is a summation frequency formed from a first and second optical carrier frequencies.

3. The method as claimed in claim 1, wherein the detecting step comprises detecting exclusively those mixed products whose optical carrier frequency is a difference frequency formed from a first and second optical carrier frequencies.

4. The method as claimed in claim 1, characterized in that the predefined frequency offset ($\Delta f$) has a positive or a negative magnitude.

5. The method as claimed in claim 1, further comprising determining spectral line strengths of the optical pulses before the generating step and at least one of the determining steps further comprises taking the spectral line lengths into account.

6. The method as claimed in claim 5, wherein the taking into account step uses the spectral line strength whose spectral line frequency corresponds to a difference frequency between the measurement frequency (fmeas) and the predefined frequency offset ($\Delta f$).

7. The method as claimed in claim 1, further comprising determining spectral line strengths before the generating step by means of a spectral power of spectral lines of the optical pulses.

8. The method as claimed in claim 6, wherein at least one of the determining steps further comprises dividing a mixed product intensity value (Im*Dm) specifying an intensity of a selected mixed product (M") by a spectral line value (Im)—specifying the spectral line strength of the spectral line of the optical pulses which is associated with the selected mixed product (M")—and forming a frequency response value (Dm) of the electrooptical component (60).

9. The method as claimed in claim 1, further comprising forming optical mixed products (M) using a nonlinear element (40) through which the optical pulses and the optical output signal (Sout) are.

10. The method as claimed in claim 1, further comprising using a 2-photon detector for detecting the optical mixed products.

11. The method as claimed in claim 1, further comprising using an optical rectifier for forming the optical mixed products.

12. The method as claimed in claim 1, wherein the forming step comprises calculating the measurement frequency in accordance with:

$$f\text{meas} = m * fp + \Delta f$$

where fmeas denotes the measurement frequency, $\Delta f$ denotes the frequency offset and fp denotes the pulse frequency.

13. The method as claimed in claim 1, further comprising predefining the predefined frequency offset ($\Delta f$) in a variable fashion.

14. The method as claimed in claim 1, further comprising forming an electrooptical component (60) from a light source (61) and a downstream electrooptical modulator (62).

15. The method as claimed in claim 1, further comprising simultaneously determining a frequency response of an optoelectrical transducer (400) within a predefined frequency band by radiating the optical output signal (Sout) generated by the electrooptical component (60) into the optoelectrical transducer (400), measuring an electrical transducer signal (S2) generated by the optoelectrical transducer (400) with formation of a transducer measured value, and using the transducer measured value and the measured frequency response of the electrooptical component (60) to determine the frequency response of the optoelectrical transducer (400).

16. The method as claimed in claim 15, wherein the determining step further comprises dividing the transducer measured value by a frequency response value (Dm) of the electrooptical component (60).

17. The method as claimed in claim 1, wherein the generating step comprises generating by means of a first high-frequency source, and generating the measurement signal (Smeas) by means of a second high-frequency source, the two high-frequency sources (10, 70) being coupled.

18. The method as claimed in claim 1, further comprising measuring a phase response of the electrooptical component (60).

19. The method as claimed in claim 18, further comprising generating a phase signal (PL1) which specifies a phase angle ($\Delta\Phi 1$) between a drive signal (SA) of a pulsed laser (20) configured to generate the optical pulses and the electrical measurement signal, measuring a phase angle between the generated phase signal (PL1) and a phase angle of the detected mixed product (M") for each of the measurement frequencies (fmeas) in each case with formation of a phase measured value ($\Delta\Phi 2$).

20. The method as claimed in claim 18, further comprising measuring a phase response of an optoelectrical transducer (400).

21. An arrangement having a pulsed laser (20), an electrooptical component (60) and a measuring device (100) having an evaluation device (120), which is configured for carrying out a method as claimed in claim 1.

22. The method as claimed in claim 1, wherein the intensity of the detected mixed product is at least one of an amplitude or root mean square value of power.

23. The method as claimed in claim 7, wherein the determining spectral line strengths step further comprises using an autocorrelator.

24. The method as claimed in claim 11, wherein the optical rectifier-is a nonlinear crystal.

25. The method as claimed in claim 17, wherein the two high-frequency sources are coupled in phase-locked fashion.

* * * * *